United States Patent [19]

Nicolay

[11] 3,975,752
[45] Aug. 17, 1976

[54] JUNCTION FIELD EFFECT TRANSISTOR
[75] Inventor: Hugh Crawford Nicolay, Melbourne, Fla.
[73] Assignee: Harris Corporation, Cleveland, Ohio
[22] Filed: Nov. 13, 1975
[21] Appl. No.: 631,759

Related U.S. Application Data
[62] Division of Ser. No. 347,681, April 4, 1973, Pat. No. 3,930,300.

[52] U.S. Cl. .................................. 357/22; 357/20; 357/41; 357/55
[51] Int. Cl.² ......................................... H01L 29/80
[58] Field of Search ................... 357/20, 22, 23, 41, 357/55

[56] References Cited
UNITED STATES PATENTS

| 3,126,505 | 3/1964 | Shockley | 357/22 |
| 3,293,511 | 12/1966 | Gault | 357/22 |
| 3,878,552 | 4/1975 | Rodgers | 357/55 |

Primary Examiner—Andrew J. James
Assistant Examiner—Joseph E. Clawson, Jr.
Attorney, Agent, or Firm—Leitner, Palan & Martin

[57] ABSTRACT

A junction field effect transistor having a V-shaped upper gate, dividing said planar source and drain regions, formed by etching a (100) crystal oriented semiconductor material of one conductivity type and diffusing with material of opposite conductivity type.

6 Claims, 3 Drawing Figures

JUNCTION FIELD EFFECT TRANSISTOR

This is a divisional of application Ser. No. 347,681, filed Apr. 4, 1973, now U.S. Pat. No. 3,930,300.

BACKGROUND OF THE INVENTION

1. Field of the Invention

The present invention relates generally to junction field effect transistors and more particularly to the fabrication of a junction field effect transistor with the aim of minimizing the devices "on resistance" and thereby increasing the yield of acceptable devices.

2. The Prior Art

Typically, it has been the practice heretofore to fabricate the top gate of a junction field effect transistor using standard photolithic and diffusion techniques. Oxide is grown over the source and drain material, photoresist is deposited and developed, and the oxide and photoresist is selectively removed by planar etching to form a rectangular gate aperture. Gate material is then deposited and diffused into the aperture in the oxide. The width of the diffuse gate is limited by the minimum oxide line width that can be obtained by planar etching of the mask formed using present photolithic techniques. Since minimum "on resistance" ($R_{on}$) of a junction field effect transistor (JFET) is determined in part by the effective width of the gate, the $R_{on}$ of the JFET of the prior art have been limited by said minimum oxide line width.

SUMMARY OF THE PRESENT INVENTION

It has been found that a substantial increase in the number of devices in a given batch which display acceptable operating characteristics in parameters, may be achieved for JFET by decreasing on resistance, increasing the transconductance, and improving the figure of merit for a given set of terminal conditions, while holding all other device fabrication parameters constant. The desired change of these parameters is obtained in accordance with my invention by forming the upper gate of the JFET as a V-shaped moat and thus reducing the gate width. The reduction of the effective gate width below that of the minimum oxide line width obtainable with photolithographic techniques is achieved using the property of a [100] oriented silicon wafers to etch V-shaped moats when properly orientated oxide line apertures are exposed to a silicon etching environment.

Accordingly it is a principle object of the present invention to provide a junction field effect transistor having minimum effective gate width and consequently on resistance.

A related object of the present invention is to provide a method of fabricating such a junction field effect transistor.

DETAILED DESCRIPTION OF INVENTION

Figure 1:
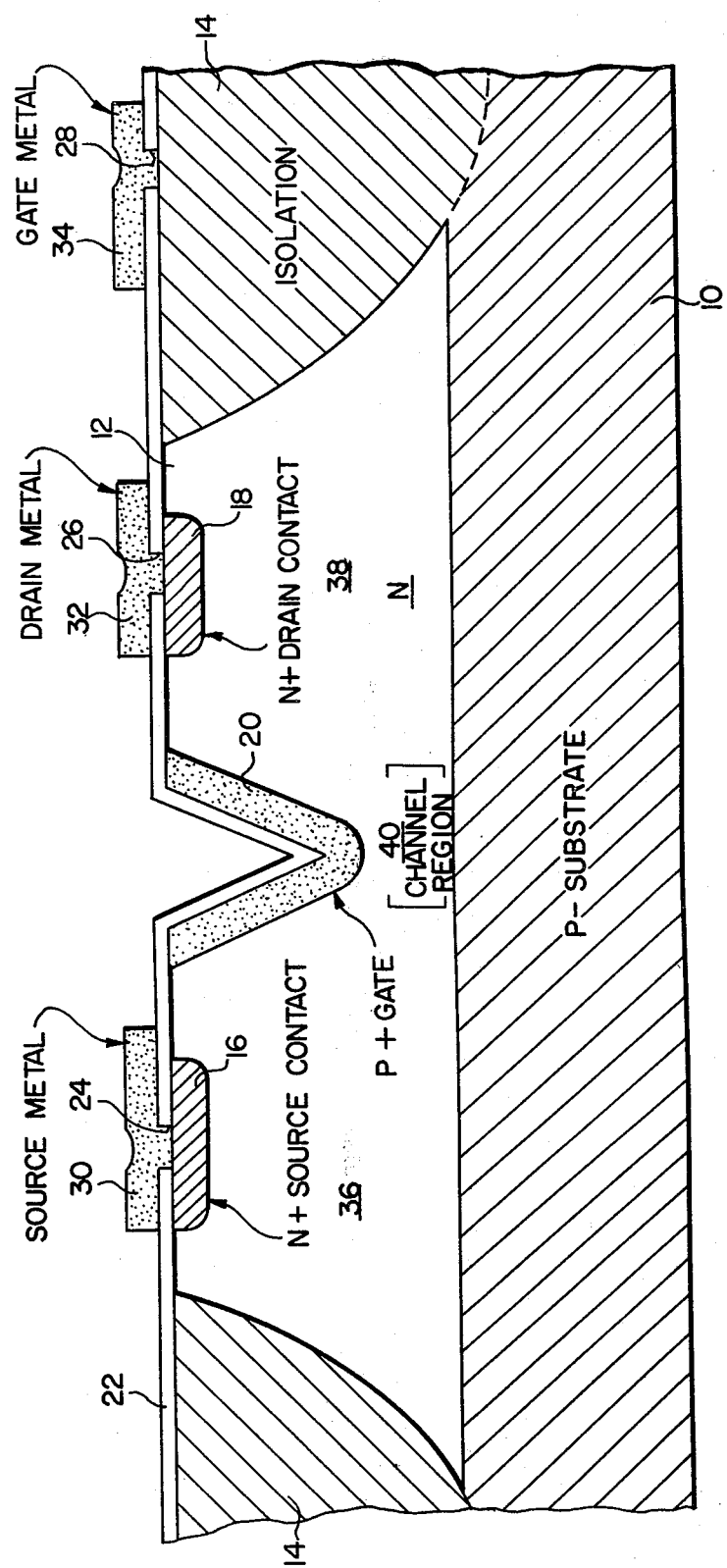
FIG. 1 is a sectional view illustrating the preferred embodiment of the junction field effect transistor.

FIG. 1 depicts an N channel junction field effect transistor fabricated according to the present invention within a body of semiconductive material 10, preferably P—type silicon. An epitaxial N-type layer of silicon 12 rests upon substrate 10 and is surrounded by a P—type diffused barrier 14 isolating it from other devices in an integrated circuit. Within epitaxial layer 12 are formed N+ type source and drain contacts 16 and 18, respectively, and a V-shaped moat, P+ type, upper gate 20. Covering the total planar surface of the present device is an insulator 22, preferably silicon dioxide $SiO_2$, with source contact aperture 24, drain contact aperture 26, and gate contact aperture 28. As shown in FIG. 1, source metal contact 30, drain metal contact 32 and gate metal contact 34 are formed in the apertures 24, 26 and 28, respectively.

Figure 2:
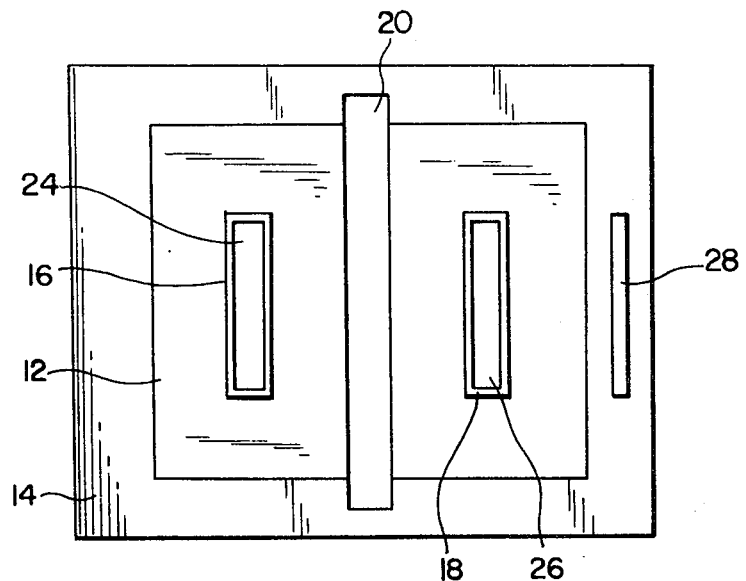
FIG. 2 is a view of the top surface of the structure of FIG. 1.

The V-shaped moat 20 divides the epitaxial layer 12 into a source region 36 and a drain region 38 connected by a channel region 40. The effective width of a channel region is minimized by the V-shaped upper gate 20 and thus decreases the on resistance, increases the transconductance, and improves the figure of merit for a given set of terminal conditions. As can be seen from FIG. 2, which is the top view with the metal layer patterns omitted, the moat 20 extends from one side of the P diffused isolation barrier 14 across the epitaxial layer 12 to the diffused isolation barrier on the other side.

In the illustrated embodiment, the substrate 10 is a single crystal P type silicon having a bulk resistivity of 8–40 ohms-cm and a thickness of 6–8 mils, and cut to have a planar surface having crystal orientation in the [100]plane. Upon the single crystal substrate 10 is grown an N type epitaxial layer 12 having a bulk resistivity of approximately 1 to 2 ohms-cm with an impurity concentration of approximately $3 \times 10^{15}$ atoms/cc. The epitaxial layer 12 is cleaned and a 6,000A layer of oxide is grown on its surface in a steam ambient at 1100°C. to form a diffusion mask. A photoresist and oxide etch procedure is used to expose the planar surface of layer 12 at the desired locations the photoresist is exposed to light in accordance with the desired pattern, the pattern is developed to remove unexposed portions of the photoresist, and the thus exposed portions of the oxide layer are removed with a suitable etchant. The remaining photoresist is then removed to leave an oxide mask with the windows for the subsequent isolation bearer deposition and diffusion.

Following the photoresist and oxide etch, the wafer is cleaned and processed through a conventional open tube deposition-diffusion sequence with a P—type dopant to form an isolation barrier through the N—type epitaxial layer to the P substrate having a sheet resistivity of approximately 50 ohms per square and a depth of about 0.5 mils. Preferably the P-type dopant is boron, but any other P-type dopant such as gallium is acceptable. The boron surface impurity concentration is approximately $8 \times 10^{17}$ atoms/cc for such a resistivity.

During and following the diffusion of the isolation barrier, silicon dioxide is regrown, thereby covering the isolation barrier windows and forming a complete oxide layer. Another photoresist and oxide etch procedure identical to that described above is performed to open the windows in the oxide at the desired locations for the source and drain contact regions. After cleaning the wafer, a conventional N+ type deposition-diffusion procedure is performed to form a source contact region 16 and drain contact region 18 which reduce the contact resistance at these points to the epitaxial layer 12 and have a sheet resistivity of approximately 2 ohms per square and a depth of about 2 microns. Preferably the N-type dopant is phosphorous, but other N-type dopants such as arsenic or antimony are also acceptable.

Another photoresist and oxide etch is performed on the newly regrown oxide to provide the window for the upper gate moat. Wafers are cleaned and a moat etch is performed to provide a V or wedge shaped aperture having a width of approximately 0.33 mils and a depth of approximately 0.23 mils. Since layer 12 was epitaxially grown on substrate 10, the epitaxial layer will have the [100] plane in the same orientation as the substrate and thus the etching takes place from the [100] plane surface along the [100] planes of the single crystal material to form the V-shaped moat. A conventional P+ type deposition-diffusion procedure is then performed to form the top gate 20 of a sheet resistivity of approximately 3.2 ohms per square and a depth of 1 to 5 microns. The depth of the P+ gate diffusion is adjusted to achieve the desired device electrical characteristics which are determined by the height of the channel region 40.

A photoresist and oxide resist procedure is now performed to provide window 24 for the source metal contact, window 26 for the drain metal contact and window 28 for the gate metal contact. The wafer is then chemically cleaned and approximately 40 microns of aluminum preferably is evaporated onto the wafer surface. A final photoresist and aluminum etch is performed to define the metal contacts to the source, drain and gate as shown in FIG. 1. Though using aluminum, other metals such as chrome-gold, titaium, platinum, could be used to form the metal contacts. For the sake of simplicity and clarity, no contacts are shown in the top view of FIG. 2.

The wafers are baked at a temperature of 450° for approximately 20 minutes to produce metal-silicon alloy contacts and at a temperature of 325° for approximately 15 to 30 hours to stabilize the fabricated device.

Since the top gate moat etch does not involve any thermal processing, it may be performed any time after the forming of the epitaxial layer 12. Thus the process could be performed with the moat etch after the epitaxial deposition, followed by a photoresist and oxide tech to expose the top gate moat and the P isolation regions. A heavy P deposition and short diffusion would be performed to form the top gate of the device and increase the surface impurity concentration in the isolation regions so as to prevent surface inversion and reduce contact resistance to the gate diffusions. Following a normal photoresist and oxide etch, the N+ diffusion of the source and drain contact regions would be performed followed by the formation of the aluminum contacts.

While an N channel type device has been described herein, a P channel device can likewise be fabricated by reversing the P and N type impurities. One or more of the devices can be fabricated either in a junction isolation or dielectric isolation type material. Though the V-shaped top gate was formed by deposition-diffusion process, other processes may be used to form a solid wedge shaped top gate without changing the characteristics of the invention.

Figure 3A:
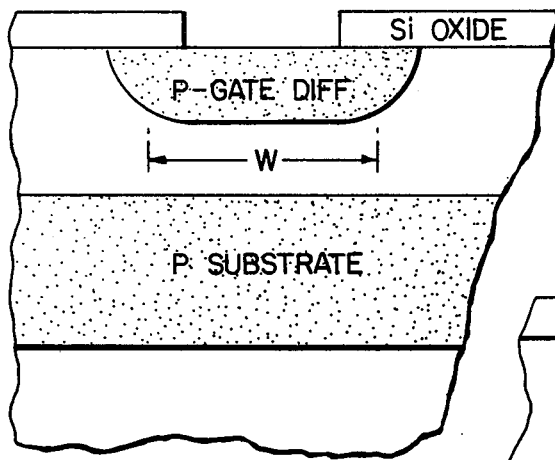
FIGS. 3a and 3b are enlarged representations of the top gate produced by the prior art methods and by the present invention, respectively.
Figure 3B:
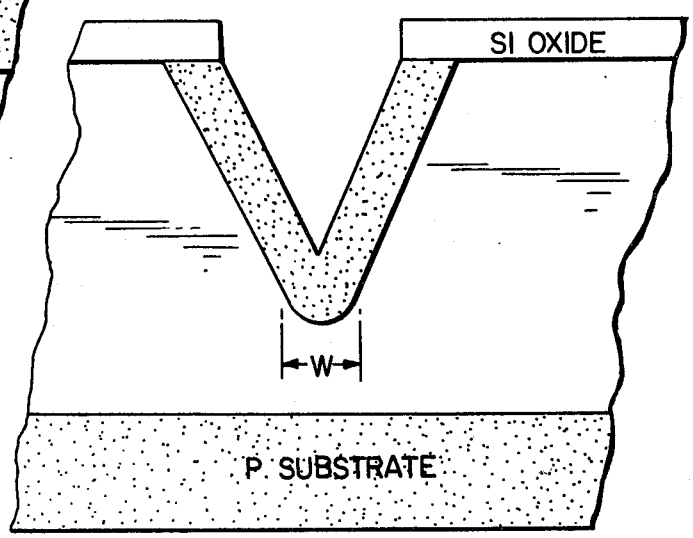

A comparison of $R_{on}$ between the rectangular diffused planar etched top gate of the prior art and the present diffused V-shaped moat etched top gate ais shown in FIGS. 3a and 3b. Using the processes of the prior art, a gate having width W of approximately 0.2 mils was formed. The process of the present invention produced a gate having a surface width of 0.33 mils and a depth of 0.23 mils. By using comparison of the on resistance of the device of the prior art and of the present invention, it has been found that the $R_{on}$ of the present invention shows a decrease of 20% over the $R_{on}$ of the JFET of the prior art. In view of the reduction of $R_{on}$ by 20%, the effective width of the V-shape is deemed to be 0.18 mils. Thus a moat, rather than a rectangular planar oxide aperture for the formulation of the top gate, produces a decreased on resistance and, therefore, an increased transconductance and an improved figure of merit as well.

What is claimed:
1. A junction field effect transistor comprising:
   a. a substrate of semiconductor material of one conductivity type having a planar surface and constituting a first gate;
   b. a first and second planar regions adjacent said surface of opposite conductivity type to said one conductivity type and constituting a source region and a drain region;
   c. a third region of opposite conductivity type to said one conductivity connecting said first and second regions below said surface and constituting a channel region; and
   d. a wedged-shaped fourth region of said one conductivity type separating said first and second regions above said third region, and constituting a second gate.

2. A junction field effect transistor as in claim 1 wherein said fourth region comprises a V-shaped groove region.

3. A junction field effect transistor as in claim 2 wherein said V-shaped groove region contours a V-shaped cross sectional opening in said planar surface.

4. A junction field effect transistor as in claim 3 wherein said V-shaped opening has a width of approximately 0.33 mils and a depth of approximately 0.23 mils.

5. A junction field effect transistor as in claim 3 wherein said V-shaped groove region has a depth in the range of 1 to 5 microns from the surface of said V-shaped opening.

6. A junction field effect transistor as in claim 1 wherein fourth region has a width of approximately 0.33 mils and a depth of approximately 0.23 mils.

* * * * *